United States Patent
Batra et al.

(10) Patent No.: US 6,232,796 B1
(45) Date of Patent: May 15, 2001

(54) APPARATUS AND METHOD FOR DETECTING TWO DATA BITS PER CLOCK EDGE

(75) Inventors: Pradeep Batra, Santa Clara; Stefanos Sidiropoulos, Palo Alto, both of CA (US)

(73) Assignee: Rambus Incorporated, Mountain View, CA (US)

( * ) Notice: Subject to any disclaimer, the term of this patent is extended or adjusted under 35 U.S.C. 154(b) by 0 days.

(21) Appl. No.: 09/358,054

(22) Filed: Jul. 21, 1999

(51) Int. Cl.[7] .......................... H03K 19/00; H03K 3/289
(52) U.S. Cl. .............................................. 326/93; 327/202
(58) Field of Search ................................ 326/93, 94, 95, 326/98; 327/202

(56) References Cited

U.S. PATENT DOCUMENTS

| | | | | |
|---|---|---|---|---|
| 4,972,518 | * | 11/1990 | Matsuo | 326/93 |
| 5,025,174 | * | 6/1991 | Shikata | 327/202 |
| 5,731,715 | * | 3/1998 | Mote, Jr. | 326/93 |
| 5,936,449 | * | 8/1999 | Huang | 326/98 |
| 5,949,251 | * | 9/1999 | Chambers | 326/93 |
| 6,064,232 | * | 5/2000 | Relph | 326/93 |

* cited by examiner

Primary Examiner—Trong Phan
(74) Attorney, Agent, or Firm—Pennie & Edmonds LLP (57) ABSTRACT

A method of detecting two bits of data transmitted with a single clock edge includes the step of assessing the value of a first data bit and a second data bit transmitted with a single clock edge to generate a first output bit indicative of the value of said first data bit. The assessing step may be implemented by integrating the first data bit and the second data bit, or by identifying signal transitions between the first data bit and the second data bit. The second output bit is produced by simply passing the second data bit.

24 Claims, 8 Drawing Sheets

APPARATUS AND METHOD FOR DETECTING TWO DATA BITS PER CLOCK EDGE

BRIEF DESCRIPTION OF THE INVENTION

This invention relates generally to the transfer of data in digital systems. More particularly, this invention relates to a high throughput data transfer technique.

BACKGROUND OF THE INVENTION

It is well known to transmit bits of data between integrated circuit components according to a system clock. Typically, one data bit is transmitted on each clock edge, whereby sampling may occur on the rising or falling edge of the clock signal. Continuing improvements in microprocessor design allow for faster clock speeds, which allow for greater data transmission rates. However, there are practical constraints associated with increasing clock speeds. For example, faster clock speeds result in larger power consumption, thermal dissipation problems, and increased electromagnetic interference.

In view of the foregoing, it would be highly desirable to more fully utilize existing clock speeds. That is, it would be highly desirable to transport more information in response to a clock edge. Such a technique would allows improved processing speeds without increasing clock speed.

SUMMARY OF THE INVENTION

A method of detecting two bits of data transmitted with a single clock edge includes the step of assessing the value of a first data bit and a second data bit transmitted with a single clock edge to generate a first output bit indicative of the value of the first data bit. The assessing step may be implemented by integrating the first data bit and the second data bit, or by identifying signal transitions between the first data bit and the second data bit. The second output bit is produced by simply passing the second data bit.

A circuit to detect two bits of data transmitted with a single clock edge includes a first circuit module to assess the value of a first data bit and a second data bit transmitted with a single clock edge. The first circuit module generates a first output bit indicative of the value of the first data bit. A second circuit module passes the value of the second data bit to produce a second output bit.

The technology of the invention more fully utilizes existing clock speeds by transporting two bits of data every clock edge without using multi-level signaling. Thus, more information is transported in response to a clock edge signal. The technique allows improved processing speeds without increasing clock speed. Advantageously, the invention can be implemented using standard components and is otherwise compatible with most circuit architectures.

BRIEF DESCRIPTION OF THE DRAWINGS

For a better understanding of the invention, reference should be made to the following detailed description taken in conjunction with the accompanying drawings, in which.

LIKE REFERENCE NUMERALS REFER TO CORRESPONDING PARTS THROUGHOUT THE DRAWINGS

DETAILED DESCRIPTION OF THE INVENTION

Figure 1:
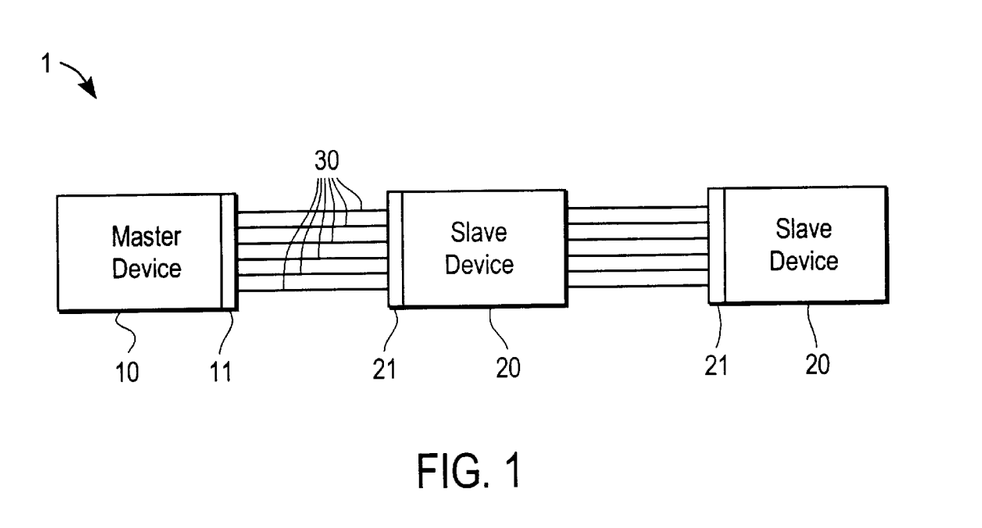
FIG. 1 illustrates an embodiment of a master/slave system, such as a computer system, configured in accordance with an embodiment of the invention.

FIG. 1 illustrates a master/slave system 1 with a master device 10 and a set of slave devices 20. By way of example, the master device 10 may be a memory controller and the set of slave devices 20 may be memory devices. The memory controller may form a portion of a central processing unit or other component. The memory devices may be DRAMs, SRAMs, or the like. Signal lines 30 form a bus that allows communication between the master device 10 and the set of slave devices 20. The master device 10 includes an interface 11 for transmitting data to the slave devices 20 and for receiving data from the slave devices 20. Each slave device 20 includes an interface 21 for receiving data from the master device 10 and for transmitting data to the master device 10.

Figure 2:
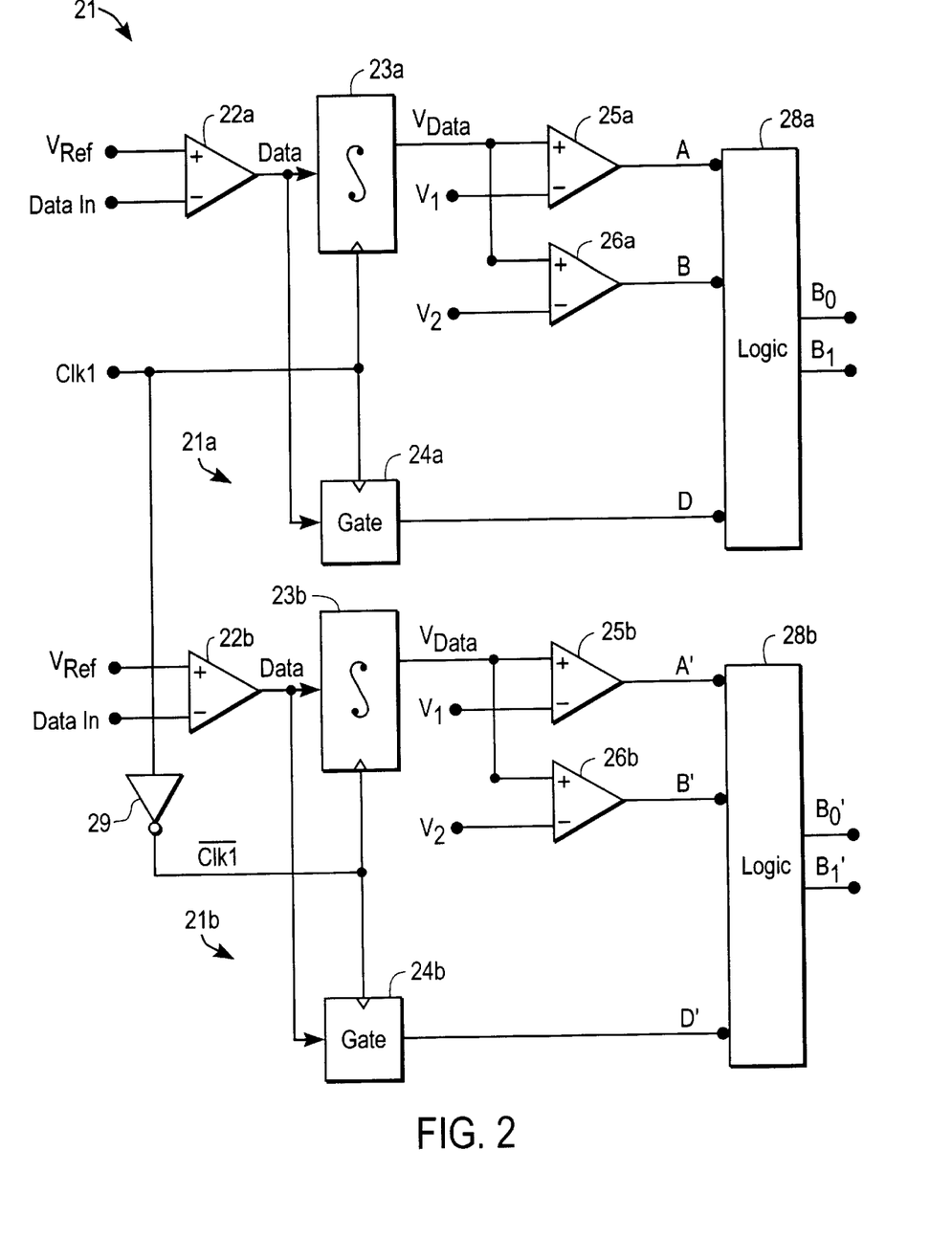
FIG. 2 illustrates a circuit for detecting two data bits on a clock edge in accordance with a first embodiment of the invention.

The present invention is directed toward an interface (e.g., the master device interface 11 or slave device interface 21) which allows the reception of two bits of data with a single clock transition. FIG. 2 illustrates a first embodiment of the invention. The basic principle of operation for the embodiment of FIG. 2 is to process both transmitted bits to determine whether the two transmitted bits are in a first group with a bit sequence of 00 or 11, or in a second group with a bit sequence of 01 or 10. Thereafter, either the first sampled bit or the second sampled bit is used to decide within the first group whether the bit sequence is 00 or 11 or decide within the second group whether the bit sequence is 01 or 10.

FIG. 2 illustrates a circuit 21 for processing data on a signal line. The circuit 21 is provided for each signal line connected to the interface circuit. The circuit 21 includes a first circuit portion 21a for processing data associated with a first clock edge and a second circuit portion 21b for processing data associated with a second clock edge. For the purpose of simplicity, the following discussion focuses on the first circuit portion 21a. The second circuit portion 21b operates in the same manner but in response to a different clock edge.

Data received at the circuit portion 21a is compared to a reference voltage $V_{REF}$ via a comparator circuit 22a. The comparator circuit 22a provides a level shifted data signal DATA. The clock signal CLK1 is routed to circuit portion 21a, and the complementary clock signal CLK1!, generated by logically inverting the clock signal CLK1 via an inverter 29, is provided to complementary circuit portion 21b. As demonstrated below, circuit portion 21a detects two data bits during the first half of the clock CLK1 cycle, i.e., when the clock signal CLK1 is high, and the circuit portion 21b detects two data bits during the second half of the clock CLK1 cycle, i.e., when the complementary clock signal CLK1! is high.

The signal DATA from the comparator 22a is provided as an input signal to a conventional integrator circuit 23a. The DATA signal is also applied to a transmission gate 24a. The transmission gate 24a may be implemented as a single transistor, with its gate controlled by the clock signal CLK1. As shown in FIG. 2, the integrator 23a and the transmission gate 24a are each clocked by the clock signal CLK1.

The integrator 23a provides an output voltage that is proportional to the length of time that the two bit input data signal is in a logical high state. The analog output voltage of the integrator 23a is applied to the positive terminals of comparators 25a and 26a. Reference voltages V1 and V2 are provided to the negative input terminals of the comparators 25a and 26a. In one embodiment, reference voltages V1 and V2 are approximately 2.5 volts and 2.0 volts, respectively. The comparator 26a outputs a logical high signal when the analog output from the integrator 23a corresponds to a digital input signal sequence of 01 or 10. Otherwise, a logical low signal is produced by the comparator 26a. The comparator 25a outputs a logical high signal when the analog output from the integrator 23a corresponds to a digital input signal sequence of 11, and otherwise outputs a logical low signal.

Figure 3:
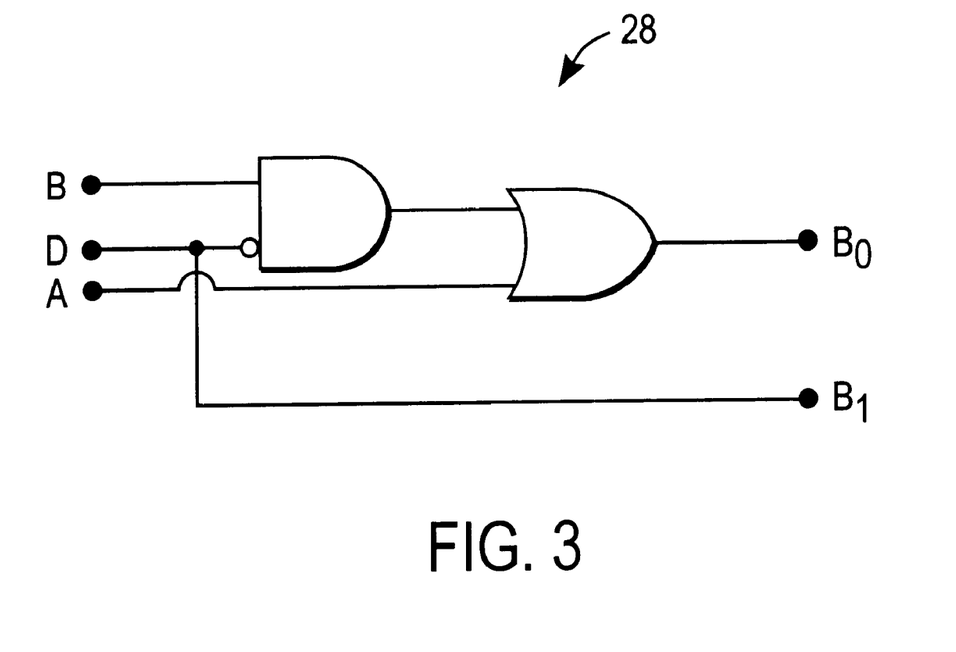
FIG. 3 illustrates combinatorial logic that is used in connection with the circuit of FIG. 2.

The comparators 25a and 26a provide digital output signals A and B to a combinatorial logic circuit 28a. The transmission gate 24a provides an output signal D to the logic circuit 28a. The logic circuit 28a logically combines signals A, B, and D to produce a first output data bit B0 and a second output data bit B1. As shown in FIG. 3, logic circuit 28 performs the following logical operation B0=A+B*D! and B1=D.

The components of the complementary circuit portion 21b are similarly configured, as shown in FIG. 2, to determine the two data bits on the following half-cycle of the clock, i.e., when the clock signal CLK1 is low (and, thus, when the clock signal CLK1! is high).

Figure 4:
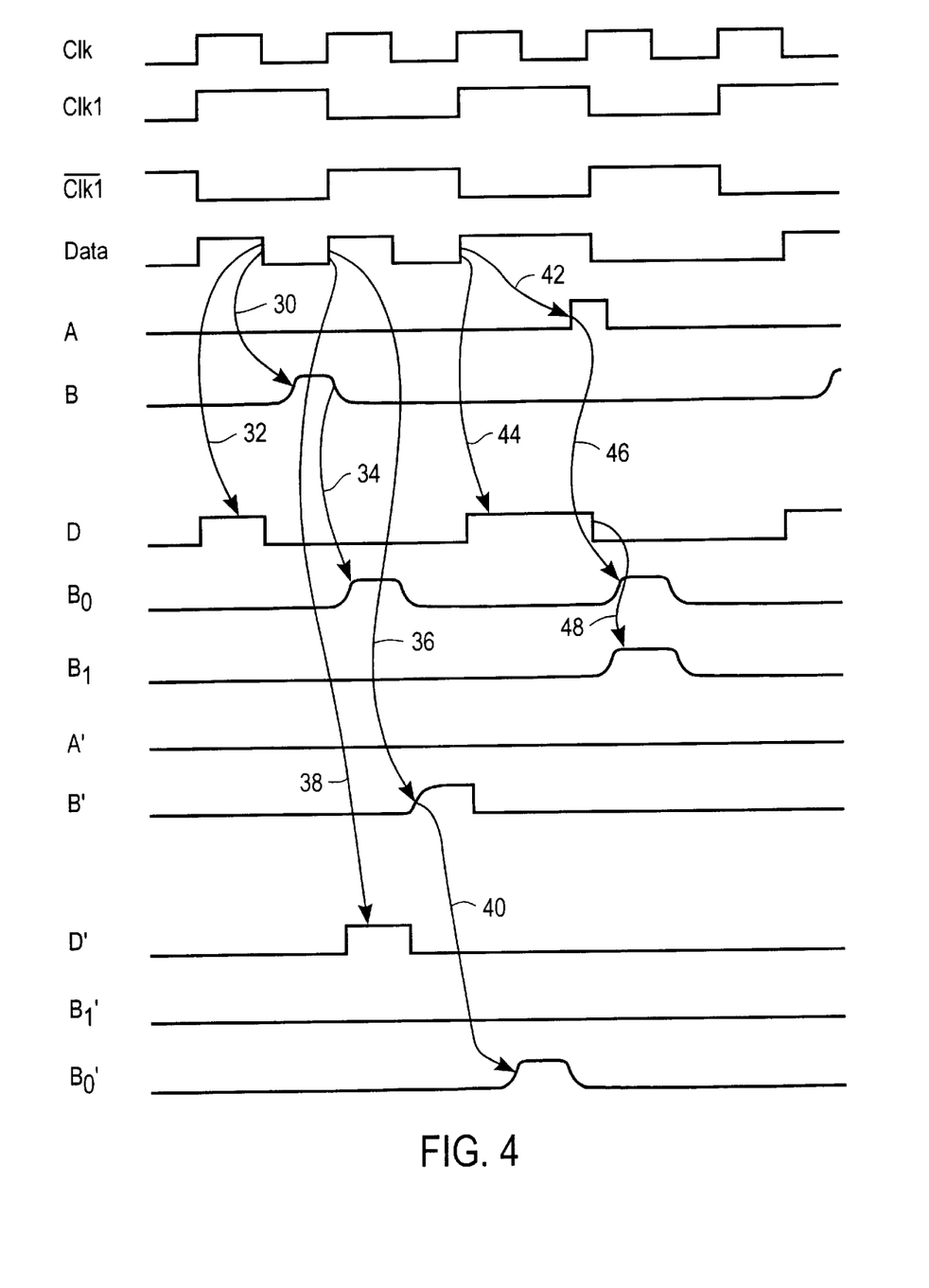
FIG. 4 is a timing diagram illustrating how the circuit of FIG. 2 processes various signals.

The operation of the circuit of FIG. 2 is more fully appreciated with reference to the timing diagrams of FIG. 4. FIG. 4 illustrates a clock signal CLK. A clock signal with half the frequency, CLK1, is also shown in FIG. 4. Further, a clock signal that is inverted and is at half the frequency of the clock signal CLK, CLK1!, is shown in FIG. 4. Circuit portion 21a operates in response to the CLK1 clock, while circuit portion 2 lb operates in response to the clock CLK1!

FIG. 4 also illustrates a random data waveform (DATA). During a first half-cycle or first clock edge of the CLK1 signal, a digital high data bit and a digital low data bit is processed by the circuit portion 21a. The digital input signal pattern of 10 causes the integrator 23a to produce a corresponding analog voltage signal. The comparator 26a responds to this analog voltage signal by producing a digital high output signal "B", as shown with arrow 30. Comparator 25a generates a digital low signal, unless the analog voltage signal from the integrator 23a corresponds to a digital input pattern of 11. Since such a pattern does not exist in this example, the signal "A" from the comparator 25a remains in a digital low state. In sum, the digital signal input pattern of 10 produces an output signal of A=0 and B=1 after a half-cycle of the clock signal CLK1.

As shown with arrow 32, the signal "D" follows the input signal. Thus, during the first half-cycle of the CLK1 signal, the signal "D" is digital high, and then digital low (i.e, a binary 10). Therefore, at the end of the half-cycle, the value "D" is a digital low signal. In sum, at the end of the first half-cycle, the combinatorial logic 28a processes the following signals: A=0, B=1, and D=0. As shown with respect to FIG. 3, this input signal pattern results in output signals of B0=1 and B1=0, which is the same as the input signal pattern. Arrow 34 illustrates the signal transition for signal B0.

The circuit portion 21b is active during the next half-cycle of the clock. That is, when CLK1! has a digital high value. During this half-cycle, a digital signal input pattern of 10 is once again processed. Since the circuit portion 21b operates in the same manner and the input signal is the same as in the previous example, all signal transitions are the same as in the previous example, as shown with arrows 36, 38, and 40.

During the next half-cycle of the clock, when CLK1 is once again high, a digital signal input pattern of 11 is processed. This input pattern causes comparator 25a to generate a digital high "A" signal, as shown with arrow 42. FIG. 4 also illustrates with arrow 44 that the signal "D" follows the input signal pattern. Thus, at the end of this half-cycle, the logic 28a processes the following signals: A=1, B=0, and D=1. As can be appreciated with reference to FIG. 3, this produces an output pattern of B0=1 and B1=1. FIG. 4 illustrates with arrow 46 how signal A generates signal B0. Similarly, arrow 48 shows how signal D generates signal B1.

Figure 5:
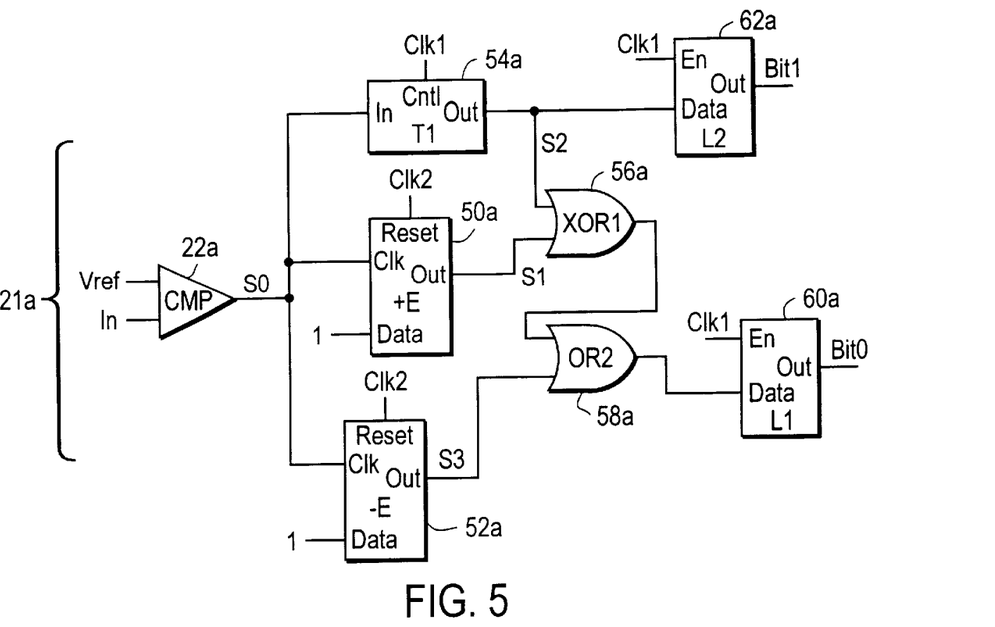
FIG. 5 illustrates a circuit for detecting two data bits on a positive clock edge in accordance with an embodiment of the invention.
Figure 6:
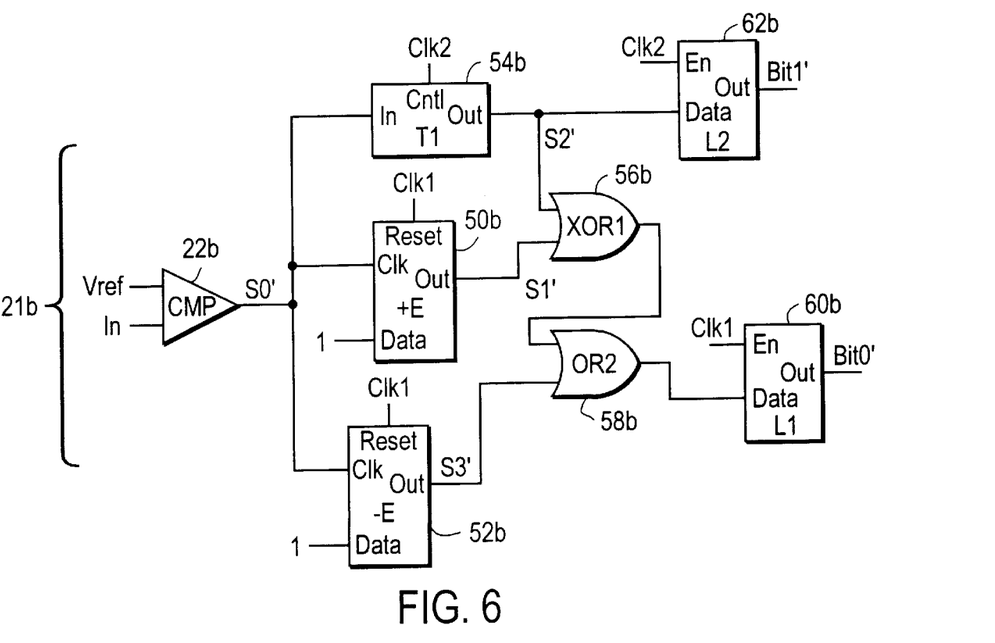
FIG. 6 illustrates a circuit for detecting two data bits on a negative clock edge in accordance with an embodiment of the invention.

Observe that the second output signal B1 corresponds to the second input signal. That is, the value of the second output signal B1 follows the value of the second input data bit. The first output signal B0 is identified by processing both the first input data bit and the second input data bit. FIGS. 5 and 6 illustrate alternate circuits that implement the same functionality. The circuit of FIG. 5 functionally corresponds to the first circuit segment of FIG. 2, while the circuit of FIG. 6 functionally corresponds to the second circuit segment of FIG. 2. The basic principle of operation for this embodiment of the invention is to use both transmitted bits to decide whether it is in a first group with a bit sequence of 01 or 11 or whether it is in a second group with a bit sequence of 10 or 00. Thereafter, either the first sampled bit or the second sampled bit is assessed to decide whether within the first group the bit sequence is 01 or 11 or whether within the second group the bit sequence is 10 or 00.

The circuit of FIG. 5 processes two data bits during a first clock edge or half-cycle, while the circuit of FIG. 6 processes two data bits during a second clock edge or half-cycle. The circuits of FIGS. 5 and 6 are identically configured, except they are responsive to different input clocks signals. Since the circuits are identical, attention will only be focused on the circuit of FIG. 5.

The circuit of FIG. 5 includes a first level-sensitive latch 50a to identify a digital low-to-high signal transition during a clock half-cycle. In response to such a condition, the latch 50a generates a digital high output signal, otherwise it provides a digital low output signal. A second level-sensitive latch 52a is used to identify a digital high-to-low signal transition during a clock half-cycle. In the event of a digital high-to-low signal transition, the latch 52a generates a digital high output signal, otherwise it generates a digital low output signal.

The circuit of FIG. 5 also includes a transmission gate 54a. As in the embodiment of FIG. 2, the transmission gate may simply be a transistor with its gate controlled by the clock signal, in this case the clock signal CLK1. A logical exclusive-OR gate 56a combines the output S2 from the transmission gate 54a and the output S1 from the latch 50a. The output of the logical exclusive-OR gate 56a operates as an input to the logical OR gate 58a. The other input to the logical OR gate 58a is the output of the latch 52a. The output from the logical OR gate 58a is driven through a flip-flop 60a, which is operative during the positive half-cycle defined by the clock signal CLK1. Similarly, the output from the transmission gate 54a is driven through a flip-flop 62a, which is operative during the same positive half-cycle of clock signal CLK1. The circuit of FIG. 6 operates in the same manner, but it is responsive to the next half-cycle of the clock, that is, when the CLK2 signal is positive.

Figure 7:
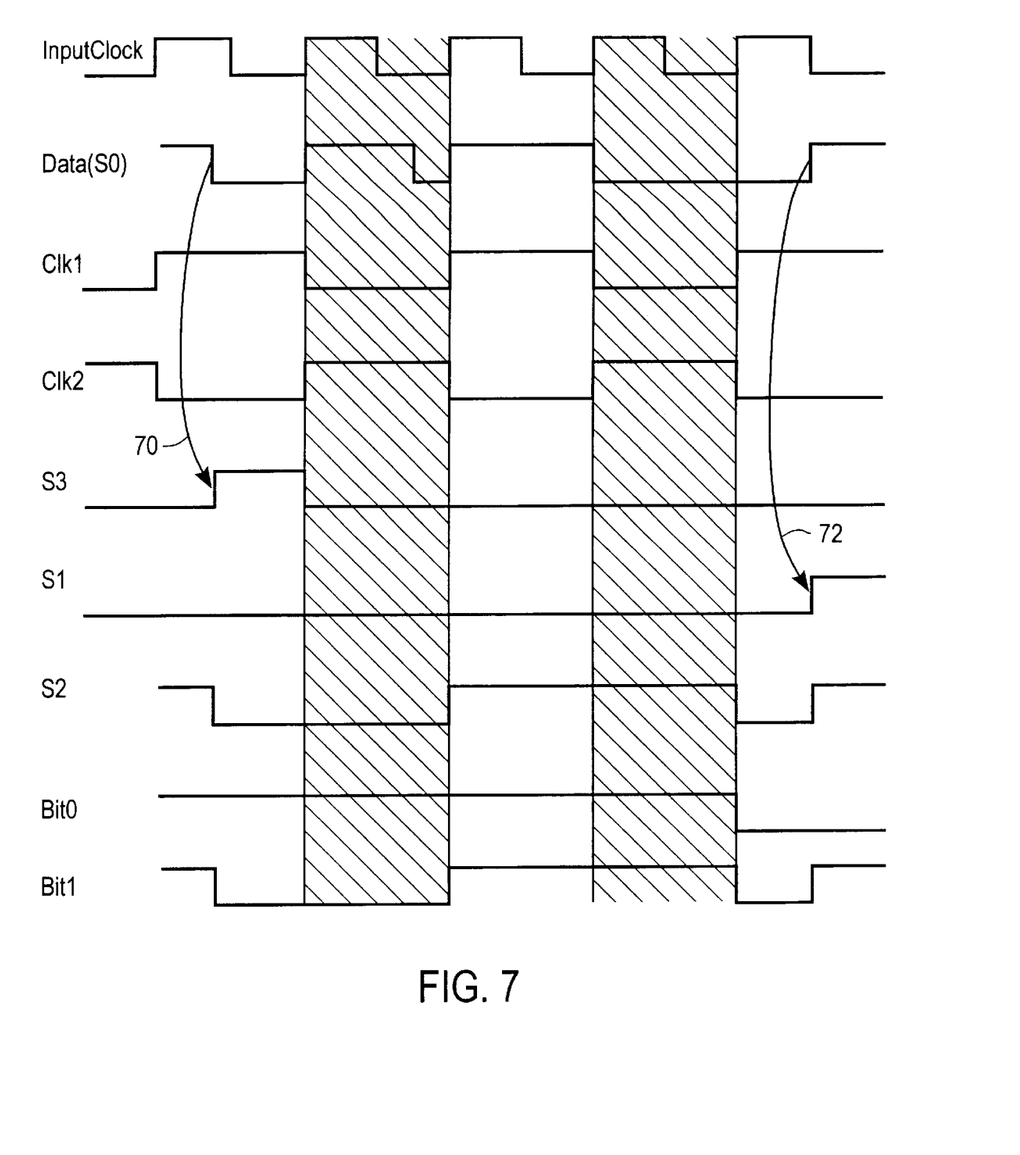
FIG. 7 is a timing diagram illustrating how the circuit of FIG. 5 processes various signals.

The operation of the circuit of FIG. 5 is more fully appreciated with reference to the timing diagrams of FIG. 7. The circuit of FIG. 5 is operative in response to a digital high CLK1 signal, therefore, the signals associated with the digital low half-cycle of the CLK1 signal are blocked out in FIG. 7. FIG. 7 illustrates input data of a digital high and a digital low (i.e., a binary signal of 10) during the first half-cycle that CLK1 is in a digital high state. The signal transition from a digital high state to a digital low state causes latch 52a to generate a digital high signal, as shown with arrow 70 in FIG. 7. The digital high signal S3 causes the OR gate 58a to generate a digital high output signal, which is passed by flip-flop 60a to produce a digital high "bit0" signal.

The transmission gate 54a simply passes the input data signal, thus, the S2 signal at the output node of the transmission gate 54a follows the input data signal, as shown in FIG. 7. At the end of the first half-cycle of the CLK1 signal, the S2 signal is a digital low, thus the "bit1+ signal at the output of the flip-flop 62a is a digital low. In sum, the "bit0" signal is a digital low, while the "bit1" signal is a digital high, therefore reproducing the input signal.

During the next half-cycle that the CLK1 signal is a digital high, a binary data input pattern of "11" is transmitted, as shown in FIG. 7. Since there is no signal transition in this case, the level-sensitive latches 50a and 52a do not produce a digital high signal. As previously discussed, the transmission gate 54a passes the input signal. The first digital high data bit is applied to one input of the exclusive-OR gate 56a, while the other input to the exclusive-OR gate remains low because the latch 50a has not identified a signal transition. This input pattern causes the exclusive-OR gate to generate a digital high signal, which causes the OR gate 58a to produce a digital high signal, resulting in a digital high "bit0" signal. The second digital high data bit is routed through the transmission gate 54a and through the flip-flop 62a to produce a digital "bit 1" signal. Thus, the "bit0" and "bit 1" signals reproduce the input signal pattern.

A digital low bit and a digital high bit are transported during the final half-cycle of the CLK1 signal shown in FIG. 7. The low-to-high transition causes latch 50a to generate a digital high signal, as shown with arrow 72. This digital high signal is applied to one input node of the exclusive-OR gate 56a. The other input node of the exclusive-OR gate also receives a digital high input signal because the transmission gate 54a causes the S2 signal to follow the input signal. These inputs cause the exclusive-OR gate 56a to generate a digital low input, which is passed by the logical OR gate 58a and the flip-flop 60a to produce a digital low "bit0" value. The "bit1" value corresponds to the S2 signal, which follows the input signal. Since the second bit of the input signal is a digital high signal, the "bit1" value is a digital high signal. In sum, the "bit0" and "bit1" signals reproduce the input signal.

Figure 8:
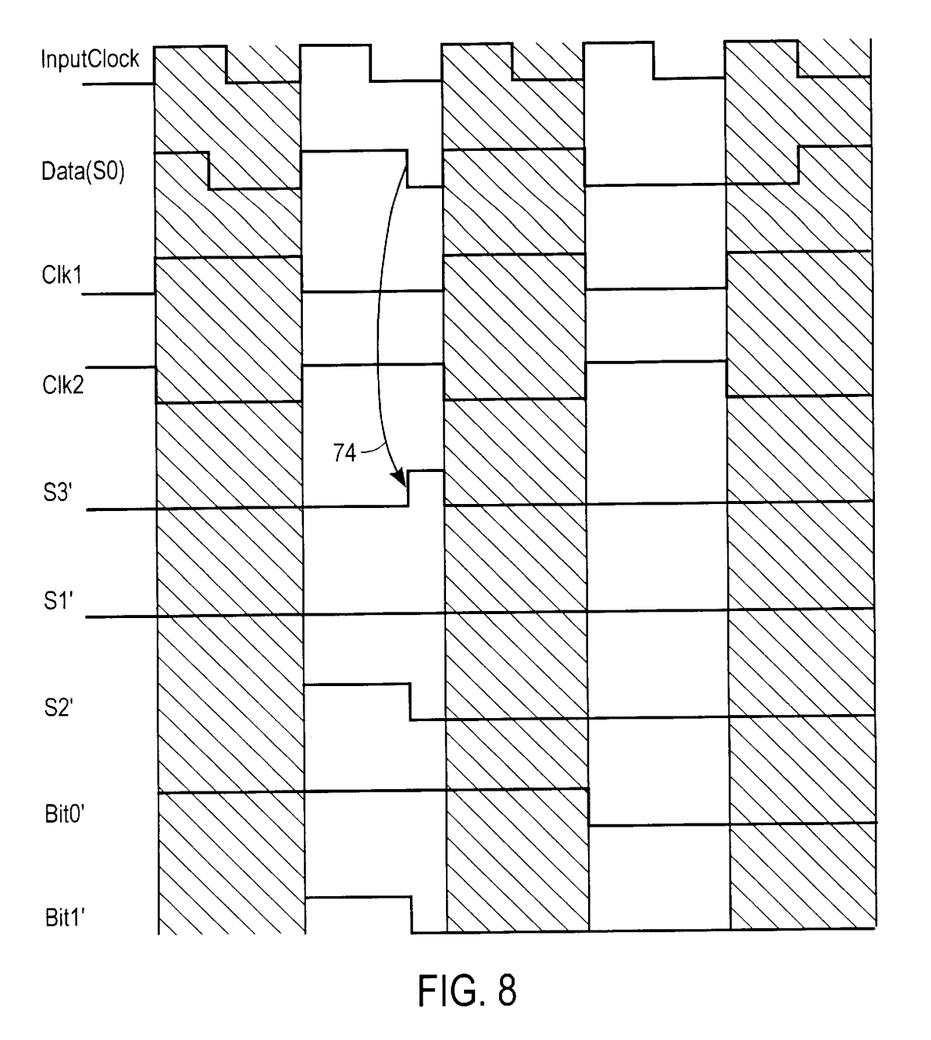
FIG. 8 is a timing diagram illustrating how the circuit of FIG. 6 processes various signals.

FIG. 8 illustrates waveforms processed by the circuit of FIG. 6. The circuit of FIG. 6 is operative when the CLK2 signal is in a digital high state (and the CLK1 signal is in a digital low state). Observe that the CLK2 digital high signal enables the transmission gate 54b, the flip-flop 60b, while the digital low CKL1 signal disables the corresponding components in FIG. 5.

The first data input pattern transmitted in FIG. 8 has a first digital high bit and a second digital low bit. The high-to-low transition causes latch 52b to generate a digital high signal, as shown with arrow 74. This digital high signal is passed through the OR gate 58a and the flip-flop 60a to produce a digital high "bit0'" signal. As previously discussed, the S2' signal follows the input signal, thus the "bit1'" signal has a digital low value at the end of the half-cycle. In sum, the "bit0'" signal has a digital high value, while the "bit1'" signal has a digital low value.

During the next digital high CLK2 signal, two digital low data bits are transmitted. Since there is no signal transition, the latches 50b and 52b generate digital low signals. Similarly, the transmission gate 54b passes digital low signals. The exclusive-OR gate 56a processes digital low signals, and thereby generates a digital low signal. The exclusive-OR gate digital low output is applied to the OR gate 58a along with another digital low signal, producing a digital low signal as "bit0'". Since signal S2' follows the input signal, the digital low second bit causes a digital low"bit1'" signal. In sum, the "bit0'" and "bit1'" signals are low, replicating the input data bit pattern.

Figure 9:
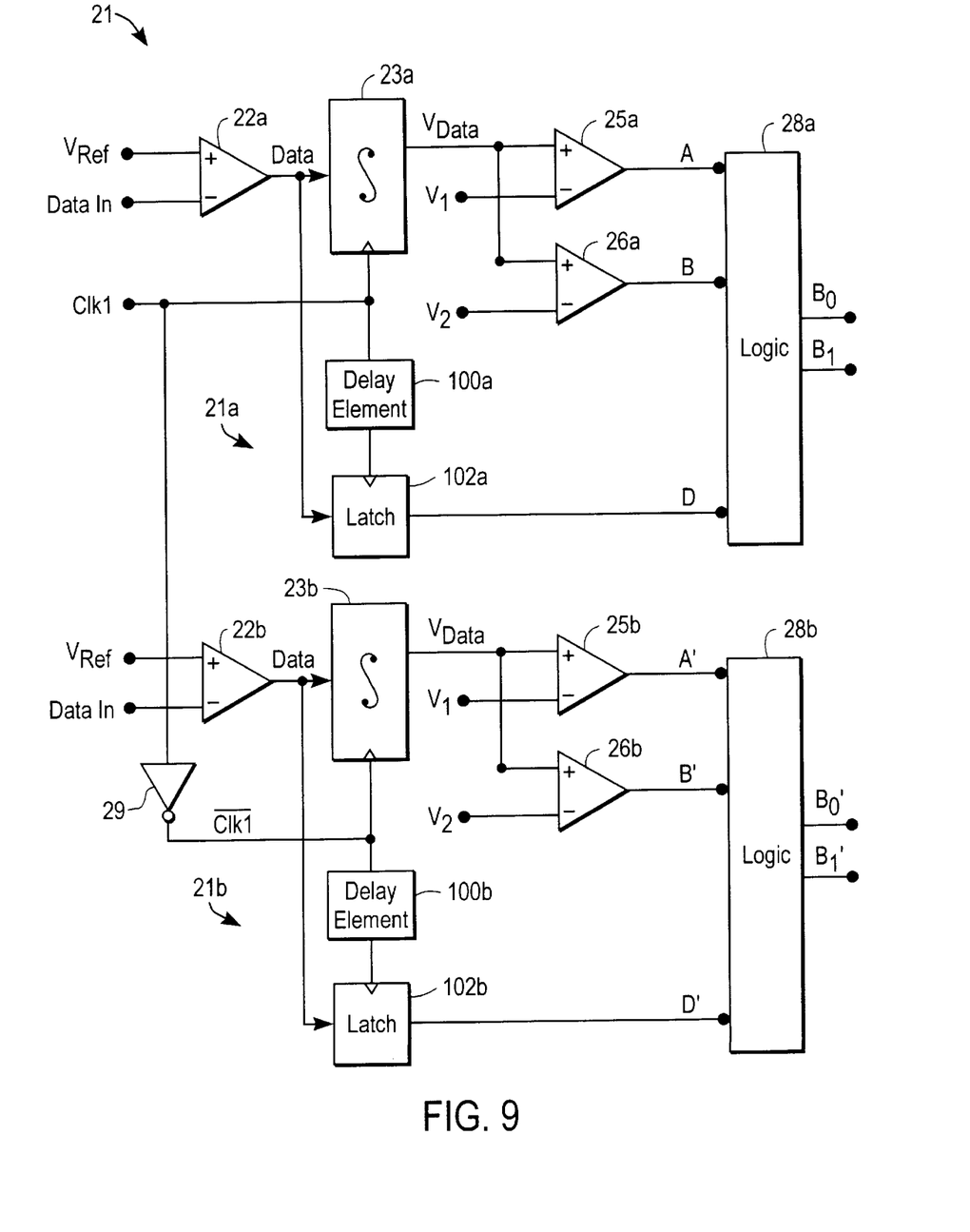
FIG. 9. illustrates a circuit for detecting two data bits on a clock edge in accordance with another embodiment of the invention.

FIG. 9 illustrates an alternate embodiment of the invention. The embodiment of FIG. 9 corresponds to the embodiment of FIG. 2, except that delay elements 100a and 100b are incorporated into the embodiment of FIG. 9 and the gates 24a and 24b of FIG. 2 are replaced with edge triggered latches 102a and 102b. The delay elements and latches are used to alter the sequence of processing of the individual input bits. That is, the bit B0 is produced by latching the first data input bit after the delayed CKL1 signal is received at the latch 80a from the delay element 100a. Bit B1 is produced by processing the two input bits. Similar processing occurs at circuit 21b with the delay element 100b and the latch 102b.

Thus, for the embodiment of FIG. 9, the output is defined as follows: B0=D and B1=A+B*D!. Observe that this is the opposite of the case of the embodiment of FIG. 2, where the output is defined as follows: B1=D and B0=A+B*D!. Similar components may be incorporated into the circuits of FIGS. 5 and 6 to establish a reversal of the sequence in which the bits are processed.

This alternate embodiment is introduced for the purpose of demonstrating that an individual output bit (e.g., B0) may be produced by either processing two data bit signals (e.g., B0=A+B*D! in the embodiment of FIG. 2) or by simply passing a single data bit signal (e.g., B0=D in the embodiment of FIG. 9). Therefore, it should be appreciated that a reference to a "first output bit" in the claims designates either output bit (i.e., B0 or B1), and that a reference to a "second output bit" in the claims designates an opposite output bit (i.e., B1 or B0).

The technology of the invention facilitates full utilization of existing clock speeds by transporting two bits of data every clock edge. Thus, more information is transported in response to a clock edge signal. The technique of the invention allows improved processing speeds without increasing clock speed. Advantageously, the invention can be implemented using standard components and is otherwise compatible with most circuit architectures.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

In the claims:

1. A circuit for detecting two bits of data transmitted with a single clock edge, said circuit comprising:
   a first circuit module to assess a combined value of a first data bit and a second data bit sequentially transmitted with a single clock edge and generate a first output bit indicative of a value of said first data bit; said first circuit module including an integrator to integrate said first data bit and said second data bit to generate an analog output value, and a plurality of comparators to convert said analog output value to a plurality of digital output values; and
   a second circuit module to pass a value of said second data bit to produce a second output bit.

2. The circuit of claim 1 wherein said first circuit module further includes combinatorial logic to process said digital output value and said second output bit to produce said first output bit.

3. The circuit of claim 2 wherein said combinatorial logic includes a logical AND gate and a logical OR gate.

4. The circuit of claim 1 wherein said second circuit module includes a transmission gate controlled by said single clock edge, said transmission gate selectively passing said second data bit to produce said second output bit.

5. A circuit for detecting two bits of data transmitted with a single clock edge, said circuit comprising:
   a first level-sensitive latch to identify a high-to-low transition between a first data bit and a second data bit transmitted with a single clock edge; and
   a second level-sensitive latch to identify a low-to-high transition between said first data bit and said second data bit, said first level-sensitive latch and said second level-sensitive latch producing a signal transition digital signal;
   a circuit module to pass a value of said second data bit to produce a second output bit; and
   combinatorial logic to process said signal transition digital signal and said second output bit data bit to produce a first output bit.

6. The circuit of claim 5 wherein said combinatorial logic includes an exclusive-OR gate and an OR gate to process said signal transition digital signal and said second data bit.

7. The circuit of claim 5 wherein said second circuit module includes a transmission gate controlled by said single clock edge, said transmission gate selectively passing said second data bit to produce said second output bit.

8. The circuit of claim 7 wherein said second circuit module further includes a flip-flop connected to the output node of said transmission gate.

9. A method of detecting two bits of data transmitted with a single clock edge, said method comprising:
   assessing a first data bit and a second data bit sequentially transmitted with a single clock edge, including integrating said first data bit and said second data bit to generate an analog output value, and converting said analog output value to a plurality of digital outout values;
   generating a first output bit indicative of a value of said first data bit based on said plurality of digital output values; and
   passing a value of said second data bit to produce a second output bit.

10. The method of claim 9 wherein said assessing further includes processing said plurality of digital output values and said second output bit with combinatorial logic to produce said first output bit.

11. The method of claim 9 wherein said passing includes routing said second data bit through a transmission gate controlled by said single clock edge to produce said second output bit.

12. A method of detecting two bits of data transmitted with a single clock edge, said method comprising:
   assessing a first data bit and a second data bit sequentially transmitted with a single clock edge, including generating a signal transition digital signal in response to a signal transition between said first data bit and said second data bit;
   passing a value of said second data bit to produce a second output bit; and
   generating a first output bit indicative of a value of said first data bit based on said signal transition digital signal and said second output bit.

13. The method of claim 12 wherein said assessing includes processing said signal transition digital signal and said second data bit with combinatorial logic to produce said first output bit.

14. The method of claim 11 wherein said passing includes routing said second data bit through a transmission gate controlled by said single clock edge and through a flip-flop to produce said second output bit.

15. A circuit for detecting a first data bit and a second data bit sequentially transmitted on a single transmission line with a single clock edge, said circuit comprising:
   a first circuit module to pass a value of said second data bit to produce a first output representing the value of said second data bit; and
   a second circuit module comprising first circuitry to generate a first signal when said first data bit and second data bit differ and second circuitry to generate a second output representing a value of said first data bit based on said first signal and said first output.

16. The circuit of claim 15 wherein said first circuit module comprises a transmission gate.

17. The circuit of claim 16 wherein said second circuitry comprises an integrator to integrate said first data bit and said second data bit and generate an integrated output.

18. The circuit of claim 17 wherein
    said second circuitry includes:
    a first comparator to generate said first signal based on said integrated output and a first reference signal;
    a second comparator to generate a second signal based on said integrated output and a second reference signal; and combinatorial logic circuitry to receive said first output, said first signal and said second signal, and generate said second output.

19. The circuit of claim 15 wherein said second circuitry further comprises:

a first level-sensitive latch to detect a low-to-high transition and produce said first signal;

a second level-sensitive latch to detect a high-to-low transition and produce a second signal; and combinatorial logic circuitry to receive said first output, said first signal and said second signal, and generate said second output.

20. A data communication method using a clock signal having a first phase and a second phase, said method comprising:

receiving in sequence a first bit and a second bit during said first phase;

generating a first signal when said first bit and said second bit differ;

generating a first output representing a value of said second bit; and generating a second output representing a value of said first bit based on said first signal and said value of said second bit.

21. The method of claim 20 wherein said second bit is received after said first bit is received.

22. The method of claim 21 wherein said generating said first signal comprises:

integrating said first bit and said second bit to produce an integrated output; and comparing said integrated output with a reference signal to generate said first signal.

23. The method of claim 22 further comprising:

generating a second signal when said first bit and said second bit are logic high.

24. The method of claim 21 wherein said first signal is generated when said second bit is logic high; and generating said second output includes:

generating a second signal when said first bit is logic high and said second bit is logic low; and generating said second output based on said first signal, said second signal and said first output.

* * * * *